United States Patent [19]
Arcoleo

[11] Patent Number: 6,167,528
[45] Date of Patent: *Dec. 26, 2000

[54] PROGRAMMABLY TIMED STORAGE ELEMENT FOR INTEGRATED CIRCUIT INPUT/OUTPUT

[75] Inventor: Mathew Arcoleo, San Jose, Calif.

[73] Assignee: Cypress Semiconductor, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/576,081

[22] Filed: Dec. 21, 1995

[51] Int. Cl.$^7$ ........................................................ G06F 1/04
[52] U.S. Cl. ............................................. 713/501; 713/503
[58] Field of Search ...................................... 395/556, 558; 713/501, 503

[56] References Cited

U.S. PATENT DOCUMENTS

| | | | |
|---|---|---|---|
| 5,229,668 | 7/1993 | Hughes, Jr. et al. | 307/605 |
| 5,272,390 | 12/1993 | Watson, Jr. et al. | 307/269 |
| 5,446,867 | 8/1995 | Young et al. | 395/558 |
| 5,467,464 | 11/1995 | Oprescu et al. | 395/551 |
| 5,692,165 | 11/1997 | Jeddeloh et al. | 395/551 |

*Primary Examiner*—Dennis M. Butler
*Attorney, Agent, or Firm*—Wagner Murabito & Hao

[57] ABSTRACT

A programmable skew buffer for optimizing the timing at the input or output pins of a memory device. The timing at each input and output pin of the memory device can be adjusted on an independent basis by coupling each input or output pin to a separate programmable skew buffer. The programmable skew buffer includes a clocked storage element that receives data from an input pin and outputs data to the memory array in the memory device when optimizing the input timing of the memory device, or receives data from the memory array in the memory device and outputs data to an output pin when optimizing the output timing of the memory device. The programmable skew buffer also includes a programmable delay circuit which generates one of a plurality of clock signals wherein each signal represents a delayed version of the system clock. The clock signal generated by the programmable delay circuit provides the input clock signal into the clocked storage element such that data is clocked into the clocked storage element in response to the input clock signal.

21 Claims, 15 Drawing Sheets

| PIN NUMBER | NORMAL MODE | PROGRAMMING MODE |
|---|---|---|
| PIN 1 | ADDRESS | PROGRAMMING |
| PIN 2 | ADDRESS | PROGRAM CLOCK |
| PIN 3 | ADDRESS | SHIFT DATA - IN |
| PIN 4 | ADDRESS | SHIFT DATA - OUT |
| PIN 5 | ADDRESS | COMMAND 0 |
| PIN 6 | ADDRESS | COMMAND 1 |
| PIN 7 | ADDRESS | COMMAND 2 |

FIGURE 10

PROGRAMMABLY TIMED STORAGE ELEMENT FOR INTEGRATED CIRCUIT INPUT/OUTPUT

BACKGROUND OF THE INVENTION

1. Field of the Invention

The present invention relates generally to the field of integrated circuits.

2. Description of the Related Art

As faster microprocessors become available, data processing systems operate at higher speeds, requiring faster bus frequencies and faster and larger memory devices. Currently existing memory devices, such as Static Random Access Memory Devices (SRAMs), operate with buses that transfer data at a frequency of 66 megahertz (MHz). However, as the need grows for faster bus frequencies of 100 MHz and beyond, existing memory devices can not be accessed fast enough to keep up with these faster bus frequencies.

To speed up the access time of these memory devices, the AC timing requirements of SRAMs have been improved, specifically the read and write parameters. The SRAM devices available today have evolved from the generic Asynchronous SRAM device to specialty SRAMs designed for particular applications. Specialty SRAMs include the Synchronous Burst SRAM and the Synchronous Pipelined Burst SRAMs. By adding performance enhancing features to the generic SRAM, such as self-timed writes, burst counters, and output registers, specialty SRAM devices are designed to operate in faster environments, improving the overall system performance.

Although the improved SRAM architecture has enabled these memory devices to interface with buses having frequencies up to 66 MHz, these improvements alone do not achieve the 100 MHz and beyond performance levels. Designing an SRAM device that has the ability to interface with faster bus frequencies at these levels has been proven to be a difficult task, especially over process and user corners (Vcc, temperature, . . . etc.). Therefore, other design considerations such as board lay-out and routing, on-chip clock skew and process variations also need to be taken into account to improve the performance level of the overall system design.

The overall system performance can be improved by providing a board-level clock distribution scheme. FIG. 1 is an illustration of a Personal Computer (PC) motherboard having an improved clock distribution scheme by using a dedicated clock synthesis device 13 which generates several synchronized system clocks that are distributed to the different components on the PC motherboard 100. The crystal 14 generates a frequency for the clock synthesis device 13. The clock synthesis device 13 provides the CPU 10 a system clock signal over line 15a, the chipset 11 a system clock signal over line 15b, the SRAM devices 12a and 12b a system clock signal over line 15c, and the SRAM devices 12c and 12d a system clock signal over line 15d. The CPU 10 and the chipset are coupled to the SRAM devices 12a–12d by lines 16a, 16b and 16c which carry the address, data and control signals, respectively, to provide read and write access to the SRAM devices 12a–12d.

The clock synthesis device 13, such as the CY2254 manufactured by Cypress Semiconductor, guarantees a certain clock skew between the different clock signals generated by the clock synthesis device 13. For example, the clock skew between the system clock signals sent over line 15a, 15b, 15c and 15d is 250 picoseconds (ps). A PC motherboard operating at 66 MHz can function properly with the 250 ps clock skew. For example, when the SRAM is operating at 66 MHz, the write set-up timing requirement is 2.5 nanoseconds (ns) and the write hold timing requirement is 0.5 ns, both with respect to the rising edge of the clock signal. When the system clock signal distributed to one of the SRAMs has a clock skew of 250 ps or 0.25 ns, the write hold-time period of 0.5 ns is reduced to half (0.5 ns–0.25 ns=0.25 ns). Although a 250 ps skew is adequate to guarantee system timing at 66 MHz, it is not sufficient to guarantee the system timing at a higher frequency (such as 100 MHz).

The clock synthesis solution discussed above guarantees a clock skew of about 250 ps between the system clock distributed over the various lines 15a–d, however, it does not take into account the process variations of an integrated circuit or the on-chip clock skew at each input and output pin of each integrated circuit. Furthermore, the clock synthesis solution does not compensate for the board-level clock skew associated with each integrated circuit on the board. Therefore, other methods of improving the overall system performance must be considered in achieving faster bus frequencies.

The clock distribution of the overall system (i.e. PC motherboard 100) can be further improved by using a programmable clock skew buffer, such as the CY7B991 device manufactured by Cypress Semiconductor, in place of the clock synthesis device 13. This solution compensates for the routing delays associated with the various integrated circuits in the system, and therefore takes into account the clock skew associated with the board lay-out. By using the programmable clock skew buffer, the system clock signal that is distributed to the various components in the system can be adjusted to compensate for some of the routing delays. In other words, the various clock signals distributed over lines 15a–15d can be adjusted by advancing or delaying the system clock signal to offset some of the board-level skew.

The drawback to using the programmable clock skew buffer is that the programmable clock skew buffer, such as the CY7B991, is expensive for specific applications such as personal computer applications. Furthermore, other variables such as process variations of an integrated circuit and on-chip clock skew at each input and output pin of the various integrated circuits in the system are not taken into account.

Another solution addresses the on-chip clock skew associated within an SRAM memory device. By changing the chip-level design to offset the effects of the on-chip clock skew, the margin for the SRAM read and write parameters is improved. In a typical SRAM device, there is a certain amount of clock skew across the device such that the circuit elements nearest to the input or output pads receive the clock input signal sooner than the circuit elements that are farthest away from the on-chip clock signal. The circuit elements may be the input or output buffers associated with each input or output pin of the SRAM device. To account for the clock skew between the different circuit elements, the SRAM device is designed to center the set-up and hold time parameters to the "middle of the road" scenario to minimize the overall effect of the on-chip skew. FIG. 2 is an illustration of the "middle of the road" approach.

FIG. 2 illustrates an overview of an SRAM device at the die level. FIG. 2 includes memory array 21 surrounded by a plurality of input and output pads. Input pads 20b–20l are coupled to pad 20a which receives the clock input signal.

Associated with each input pad 20b–20l is a latch (not shown) that operates as a storage element for each pad.

Assuming there is a total of 400 ps clock skew across the SRAM device 22, the latches will be designed to the middle of the distribution (e.g. 200 ps). In other words, the latches are all designed based upon the center of the distribution, and the worst case skew is +/−200 ps. Thus, referring back to FIG. 2, the latch for pad 20b receives an input clock signal that is advanced by 200 ps, the latch for pad 20g receives an input clock signal that has no skew, and the latch for pad 20l receives an input clock signal that is delayed by 200 ps all with regard to the design center. All latches receive the same clock, but are designed as if they were all at the center of the distribution. Although this approach may improve the overall effect on the set-up and hold time margins, a certain level of error due to the on-chip clock skew (approximately 50%) is still assumed. Thus, this solution alone does not enable the SRAM device to operate in a faster environment such as a 100 MHz system and beyond.

As discussed above, there are several skew components (i.e. board-level clock skew, on-chip clock skew, process variations and trace length mismatches of an integrated circuit, etc.) that affect the input and output timing of SRAM devices. Each of the above mentioned solutions does not address all of the variables in one solution, therefore not optimizing the AC timing parameters of an SRAM. Thus, it is desirable to take into account all skew components mentioned above by optimizing the timing of each input and output.

SUMMARY OF THE INVENTION

It is desirable to optimize the timing at the input and output pins of a memory device by offsetting the clock skew associated with each input and output pin.

It is also desirable to provide an input clocked storage element for an input pin or an output clocked storage element for an output pin such that the timing at each clocked storage element can be adjusted on an independent basis.

It is also desirable to generate one on-chip clock signal that can be adjusted to provide different versions of the on-chip clock to each input and output clocked storage element.

An apparatus for optimizing the input and output timing of an integrated circuit is described. The apparatus includes a first clocked storage element and a first clock generating circuit. The first clock generating circuit generates a first clock input signal for the first clocked storage element. The first clock input signal has a first phase. The apparatus also includes a second clocked storage element and a second clock generating circuit. The second clock generating circuit generates a second clock input signal for the second clocked storage element. The second clock input signal has a second phase, that is different from the first phase.

An apparatus for adjusting the timing at an input or output pad of an integrated circuit is also described. This apparatus includes a clocked storage element and a clock generating circuit. The clock generating circuit generates one of a plurality of clock signals which have different phases thereby providing the input clock signal to the clocked storage element. Input data is clocked into the clocked storage element in response to the input clock signal received by the clocked storage element.

A method for optimizing the input or output timing of an integrated circuit is further described. An input clock signal having a first phase for a first clocked storage element is generated. The first input data is inputted into the first clocked storage element in response to the input clock signal having the first phase. An input clock signal having a second phase for a second clocked storage element is generated wherein the second phase is not equal to the first phase. The second input data is inputted into the second clocked storage element in response to the input clock signal having the second phase.

A method for adjusting the timing at an input or output pad of an integrated circuit is further described. One of a plurality of clock signals which have different phases are generated by a programmable delay circuit. The input data is clocked into the clocked storage element in response to one of the plurality of clock signals generated.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 10 illustrates the functions designated to pins numbered one through seven of a memory device.

DETAILED DESCRIPTION

Figure 1:
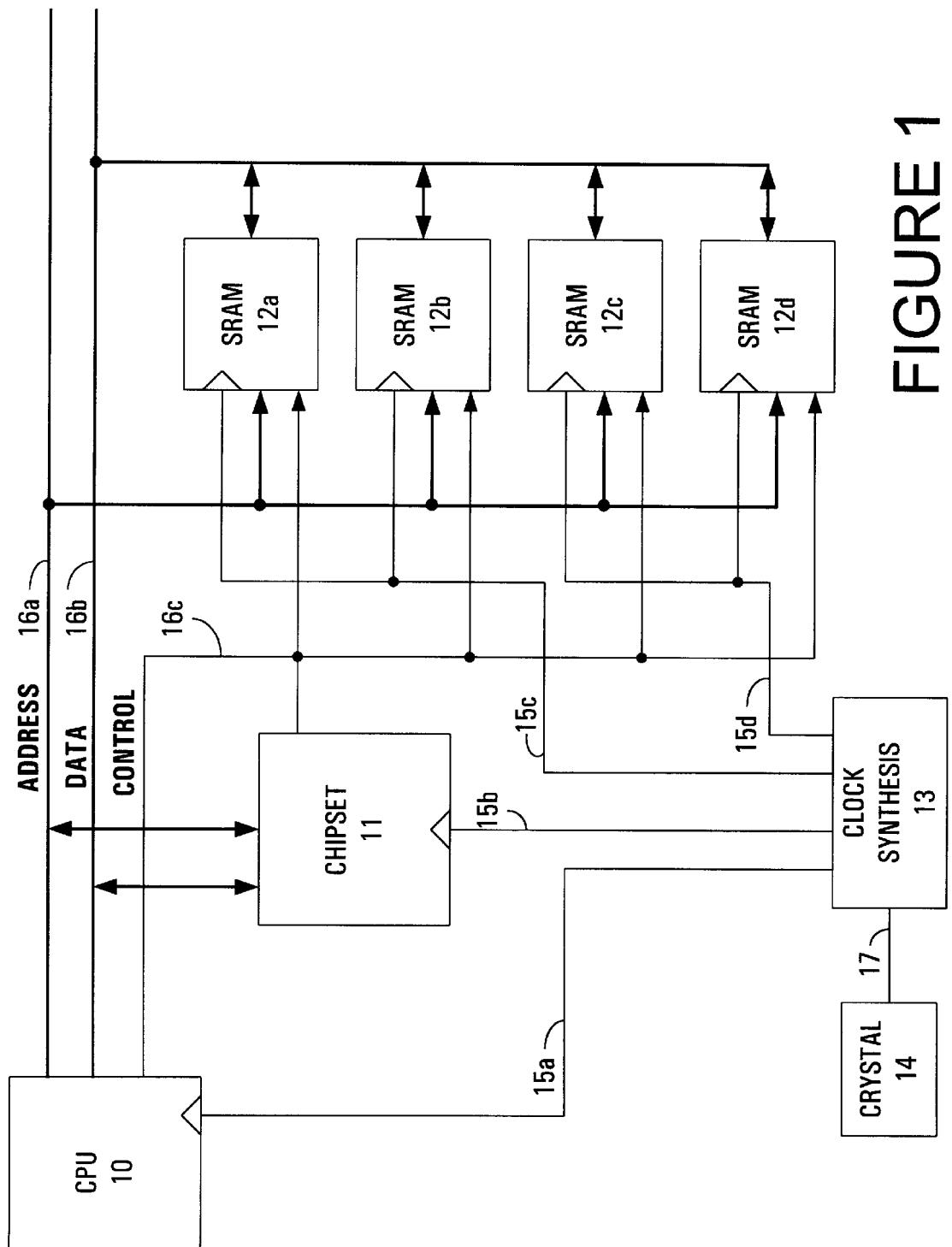
FIG. 1 illustrates the prior art board-level solution addressing clock skew.
Figure 2:
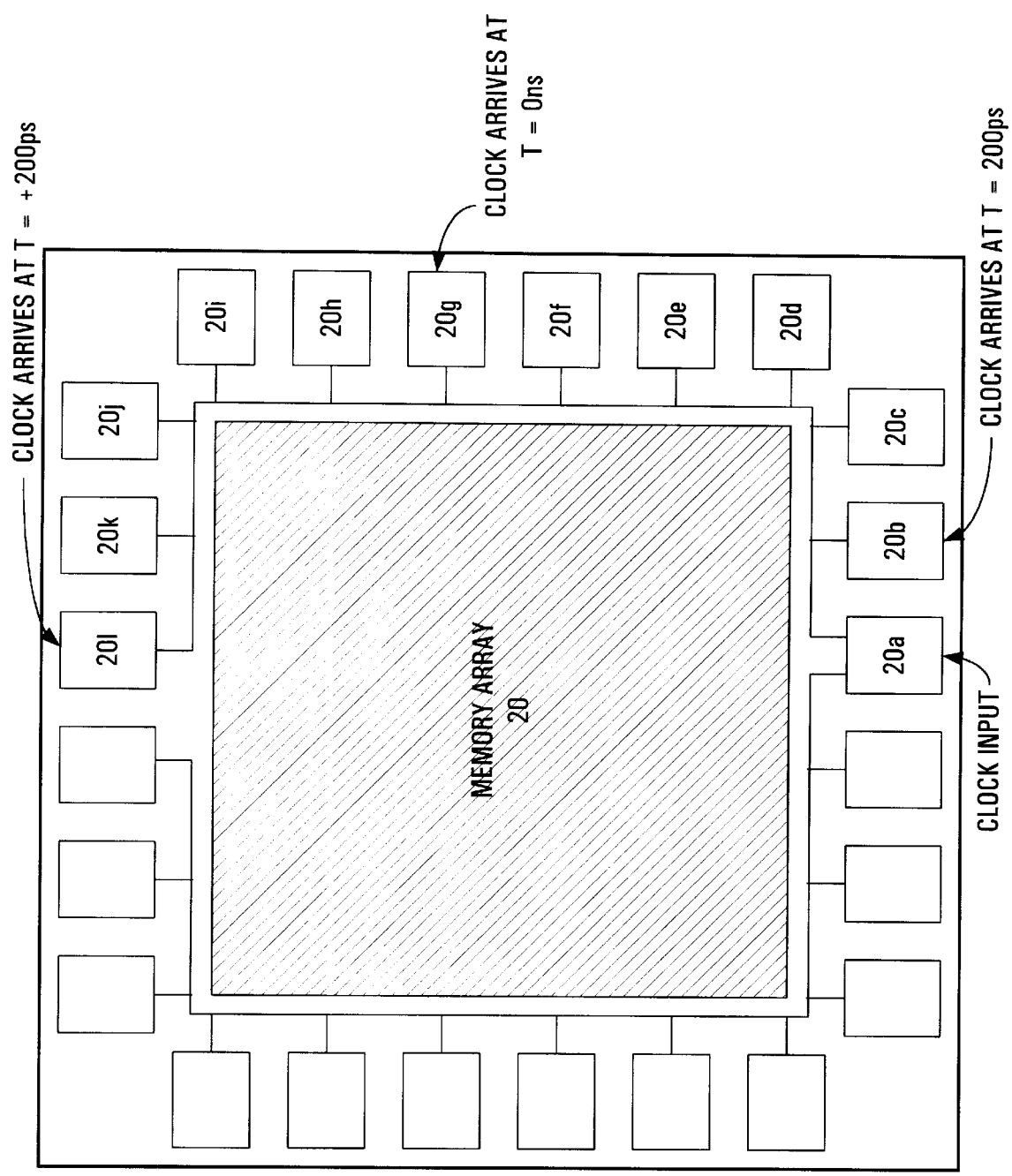
FIG. 2 illustrates the prior art chip-level solution addressing clock skew.

The following detailed description sets forth an embodiment or embodiments in accordance with the present invention for a method and apparatus for a programmable skew buffer to optimize input or output timing of data flowing into or out of an integrated circuit. In the following description, details are set forth such as specific circuitry configurations in order to provide a thorough understanding of the present invention. It will be evident, however, that the present invention may be practiced without these details. In other instances, the functioning of well-known circuit components, logic gates, etc., have not been described in particular detail so as not to obscure the present invention.

When Integrated Circuit (IC) devices are used in high speed system designs, particularly operating at frequencies above 66 MHz, the system designer must consider all skew variables that affect the system read and write parameters of the devices. These skew variables include process variations in the integrated circuits, process variations in the system, the on-chip clock skew and the board level clock skew. The apparatus in the present invention has the ability to compensate for all of these variables by adjusting the timing at each input or output pad (or pin) of the device. The present invention optimizes the AC timing of the device by providing each input or output clocked storage element at each input or output pin, respectively, with an input clock signal that is programmable. The input clock signal into each input or output clocked storage element is one of a plurality of clock signals which have different phases. In one embodiment of the present invention, the input clock signal into each clocked storage element is one of a plurality of clock signals which are delayed. Thus, the undesirable effects caused by the skew variables are offset on a pin-by-pin basis.

The present invention may be used in conjunction with various IC devices and works especially well in a Synchronous Pipelined SRAM having both an input and an output register for the following two reasons. First of all, the Synchronous Pipelined SRAM device is particularly well suited for high speed applications, such as those operating at 66 Mhz. Secondly, the present invention provides the Synchronous Pipelined SRAM device with an improved input and output register to optimize the AC timing of the device. Note that the present invention may also work well with other SRAM devices having either an input or output register.

Generally, an SRAM device receives the address, data and control signals from a controller. The controller works with the microprocessor, such as the Pentium™ processor manufactured by Intel, to run the entire system (e.g. computer system). When the system is operating at very fast frequencies (66 MHz and beyond), data must be accessed (written into or read from) the SRAM at the same rate. Therefore, as the SRAM is accessed at a faster rate, the AC timing margins of the SRAM device are reduced and data must be accessed from the SRAM with more accuracy.

In a typical SRAM operating at 66 MHz, the set-up time requirement (Tset-up) is 2.5 ns and the write hold time requirement (Thold) is 0.5 ns (or 500 ps). If the system clock is operating at 66 MHz, the clock signal has a period of 15 ns, from rising edge to rising edge. Furthermore, if the clock-to-valid-delay from the controller is 9 ns and the flight time delay is 2 ns, then the controller has 4 ns before the next rising edge of the clock (15 ns−9 ns−2 ns=4 ns). Therefore, the delta between the next rising edge of the clock seen by the controller (4 ns) and the minimum set-up time required by the SRAM (2.5 ns) is 1.5 ns. In other words, if the controller is delayed over 1.5 ns in sending the SRAM input data such as an address, data or control signal, then the set-up timing parameter of the SRAM is violated and the system will fail. The overall delay seen at each input or output pin of the SRAM may be attributed, in whole or in part, to the on-chip clock skew, the board lay-out clock skew and the process variations in manufacturing the SRAMs.

If the system clock is operating at 66 MHz and the Pentium™ has a minimum data output hold-time (Tdoh) of 1.5 ns, the delta between the hold-time required by the SRAM (0.5 ns) and the minimum data output hold-time of the Pentium™ (1.5 ns) is 1 ns. In the event the system is unable to operate within these parameters, the system will fail. Thus, to reduce the likelihood of having a system failure the skew variables that affect the read and write timing of the SRAM need to be offset.

Figure 5A:
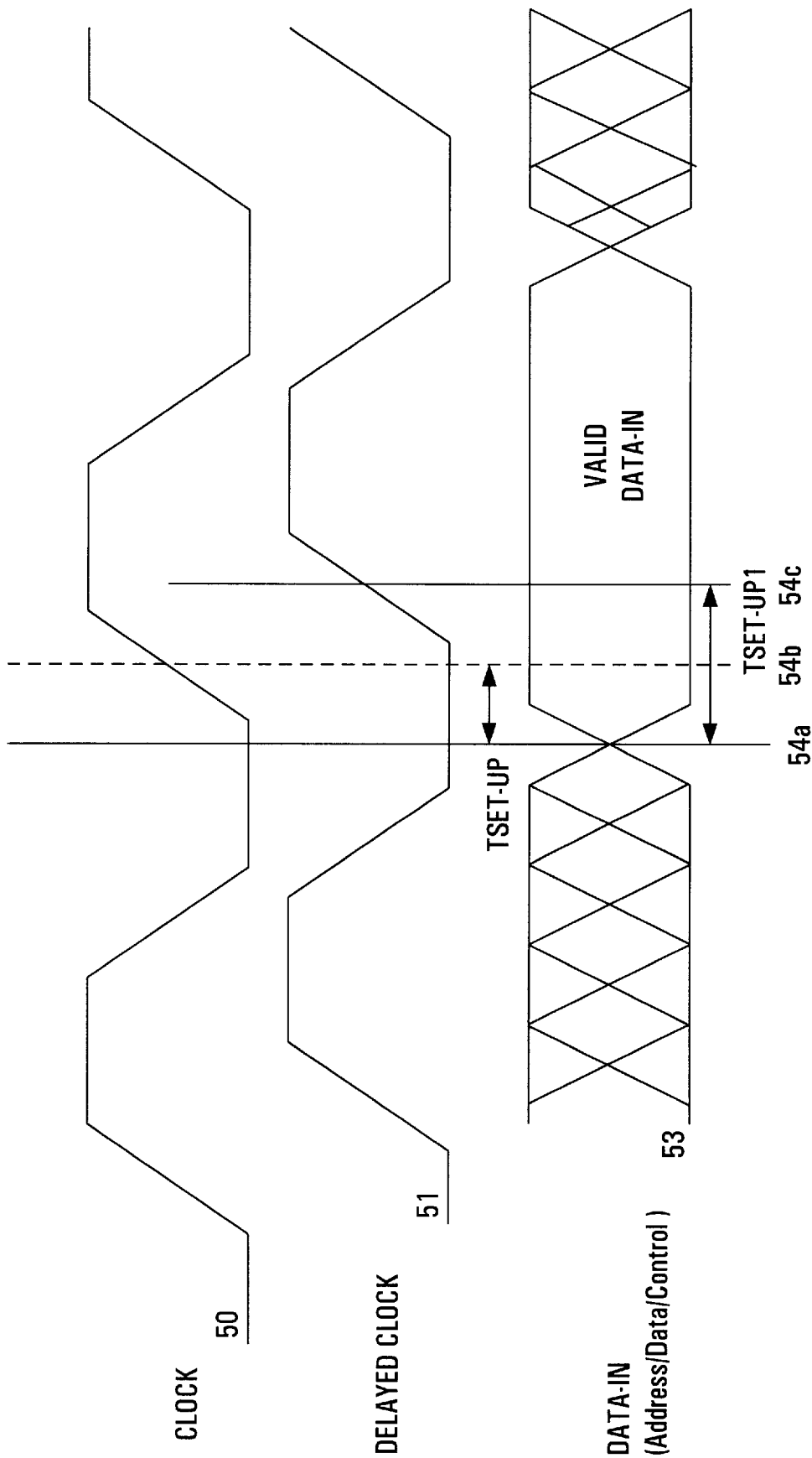
FIG. 5a illustrates the set-up timing requirement of a memory device.

Therefore, one way of improving the overall system timing margin in systems that have marginal timing or fail for Tset-up is to increase the set-up time seen by the SRAM. The timing diagrams in FIG. 5a illustrate the relationship between the system clock signal 50 (Clock), a delayed version of the system clock signal 51 (Delayed Clock) and the data-in signal 53. According to FIG. 5a, the setup time is measured from the beginning of the Valid Data-In, which may be an address, data or control signal, until the next rising edge of the clock. The set-up time Tset-up is the period between 54a and 54b when measured against the system clock signal 50, and the set-up time Tset-up 1 is the period between 54a and 54c when measured against the delayed version of the system clock (delayed clock signal 51). It is apparent from FIG. 5 that Tset-up 1 is a longer time period than Tset-up. Thus, by delaying the system clock signal 50 the rising edge of the clock is delayed and the set-up time seen by the SRAM is increased, thereby improving the timing margin.

Figure 6A:
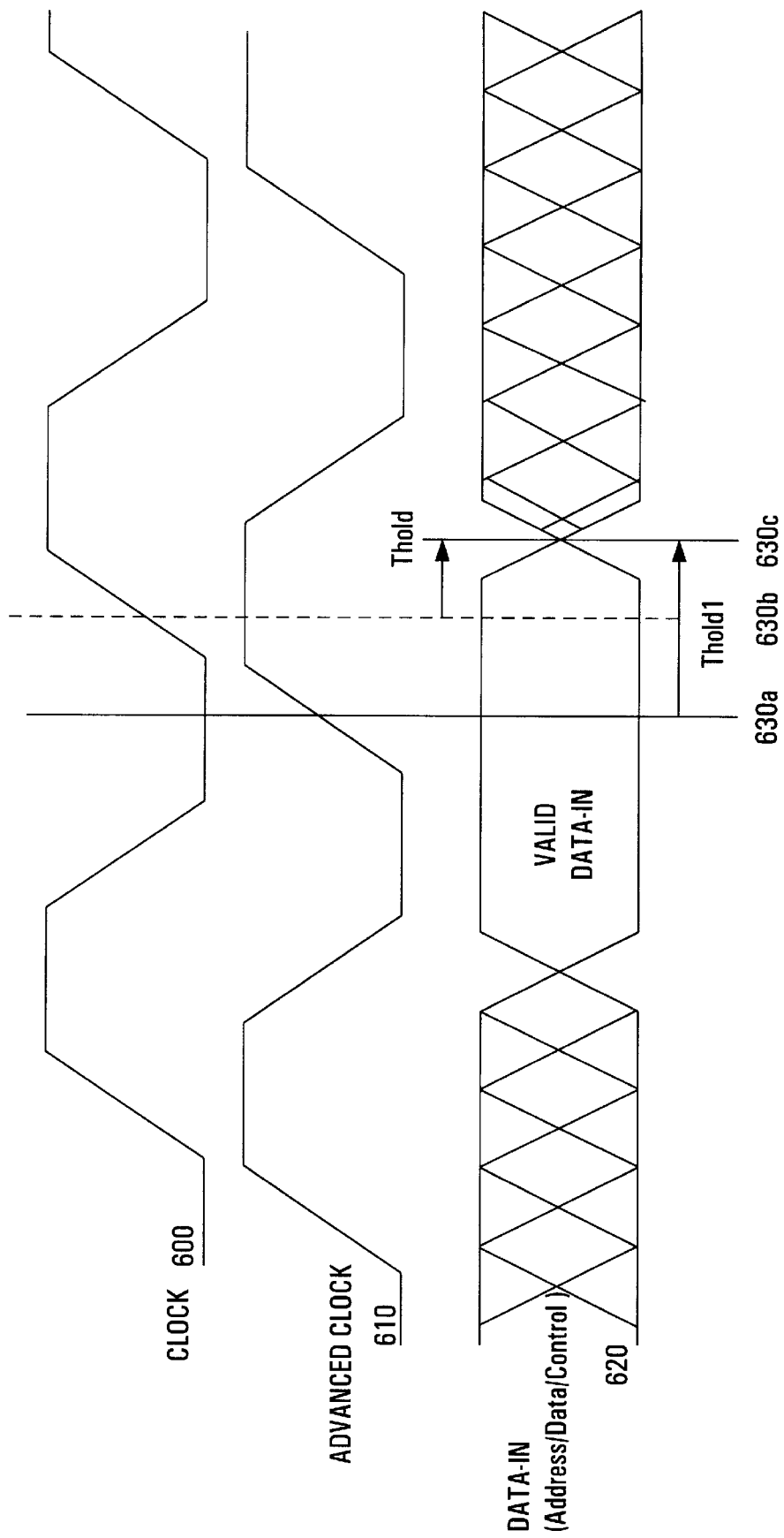
FIG. 6a illustrates the hold timing requirement of a memory device.

FIG. 6a illustrates that the hold time margin can be increased by advancing the system clock signal 60 (Clock). The Data-In signal 62, which may be address, control or data signals, is measured with respect to system clock signal 60 (Clock) and the advanced system clock signal 61 (Advanced Clock). The hold-time is measured from the rising edge of the clock signal to the end of the Valid Data-In period. Thus, the hold-time Thold measured from the system clock signa 60 is the period between 63b and 63c and the hold-time Thold1 measured from the advanced system clock signal 61 is the period between 63a and 63c. By advancing the system clock, the hold time seen by the SRAM is increased and the hold-time margin is improved. Note that when the set-up time at an input pin or pad is improved, then the hold-time at the same pin is degraded, and vice versa.

The output parameters of the SRAM device can also be adjusted on a pin-by-pin basis such that advancing the system dock will improve the clock-to-output timing (Tco) and delaying the system clock will improve the data-out hold timing (Tdoh). Note that as Tco is improved, Tdoh is degraded, and vice versa.

Figure 5B:
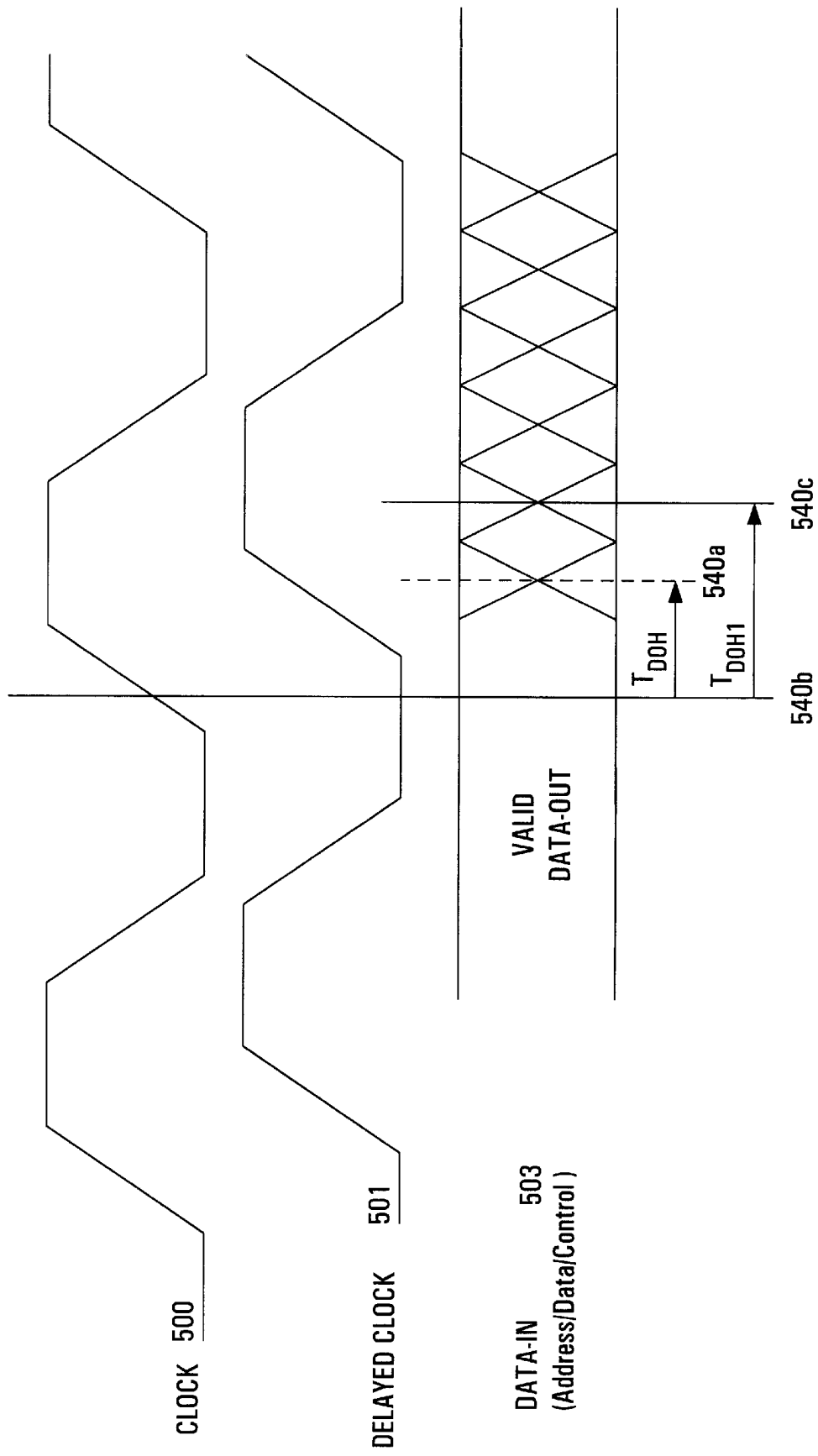
FIG. 5b illustrates the data-out hold timing requirement of a memory device.

FIG. 5b illustrates the data-out hold timing requirement of an SRAM device. The data-out hold timing requirement Tdoh is the period between 540a and 540b, and is measured from the clock rise to when the Data-Out is no longer valid. The Data-Out 503 is typically data that was stored in an SRAM, but could be an Address or Control Signal to its receiving device. The data-out hold timing Tdoh is improved when the system clock is delayed. When the valid Data-Out is measured against the Delayed Clock Signal 501, then the data-out hold timing Tdoh1 is the period between 540b and 540c, which is obviously greater than Tdoh. Note that Tdoh is measured from the system clock although the delayed clock is used in the device. The actual Tdoh of the device did not change, but the Tdoh with reference to the system clock did.

Figure 6B:
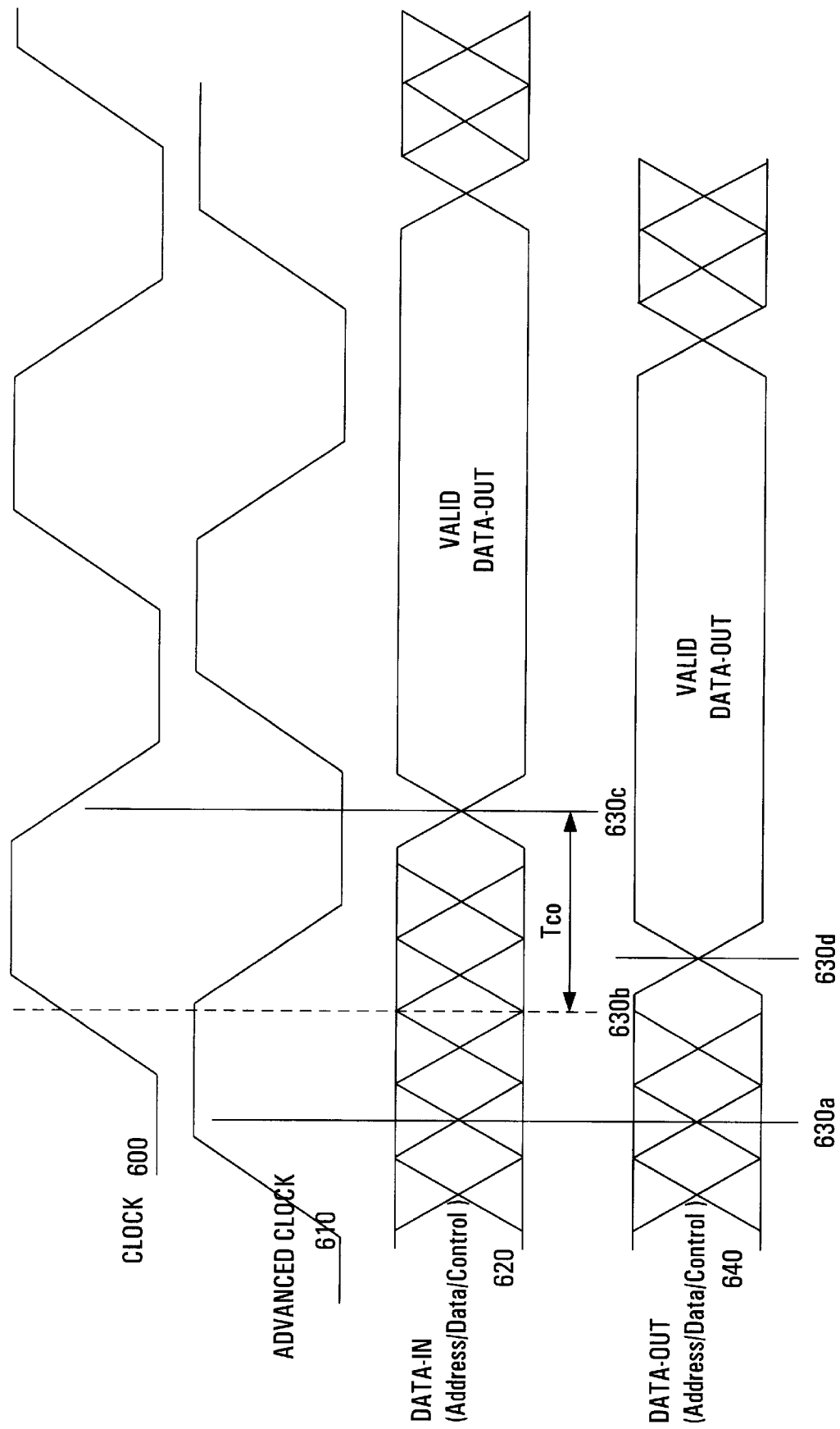
FIG. 6b illustrates the clock-to-output timing requirement of a memory device.

On the other hand, FIG. 6b illustrates the clock-to-output timing requirement of an SRAM device. The clock-to-output Tco is measured from the rising edge of the system Clock 600 to the beginning of valid Data-Out 620 or the period between 630*b* and 630*c*. However, when the clock-to-output is measured against the Advanced Clock 610, then the valid data 640 is available sooner with respect to the next rising edge of the system clock, when it will be latched by the processor or other system device. The clock-to-output Tco1 is the period between 630*a* and 630*d*.

The present invention includes an input or output buffer in an integrated circuit that can be programmed to optimize the input or output timing such as the set-up, hold, data-out hold or clock-to-output timing. The input or output buffer in the present invention may be used to adjust, on a pin-by-pin basis, the read and write AC parameters of a device, such as a Static Random Access Memory (SRAM) device. In other words, each input pin in the device has one input buffer, each output pin in the device has one output buffer, and each input/output (I/O) pin in the device has two buffers, one for the input and one for the output. Thus, the present invention may be used to improve the input register timing in a Synchronous SRAM device, and to improve the input and output register timing in a Synchronous Pipelined SRAM device. In an alternative embodiment, only selective pins have the programmable skew buffer.

Figure 3:
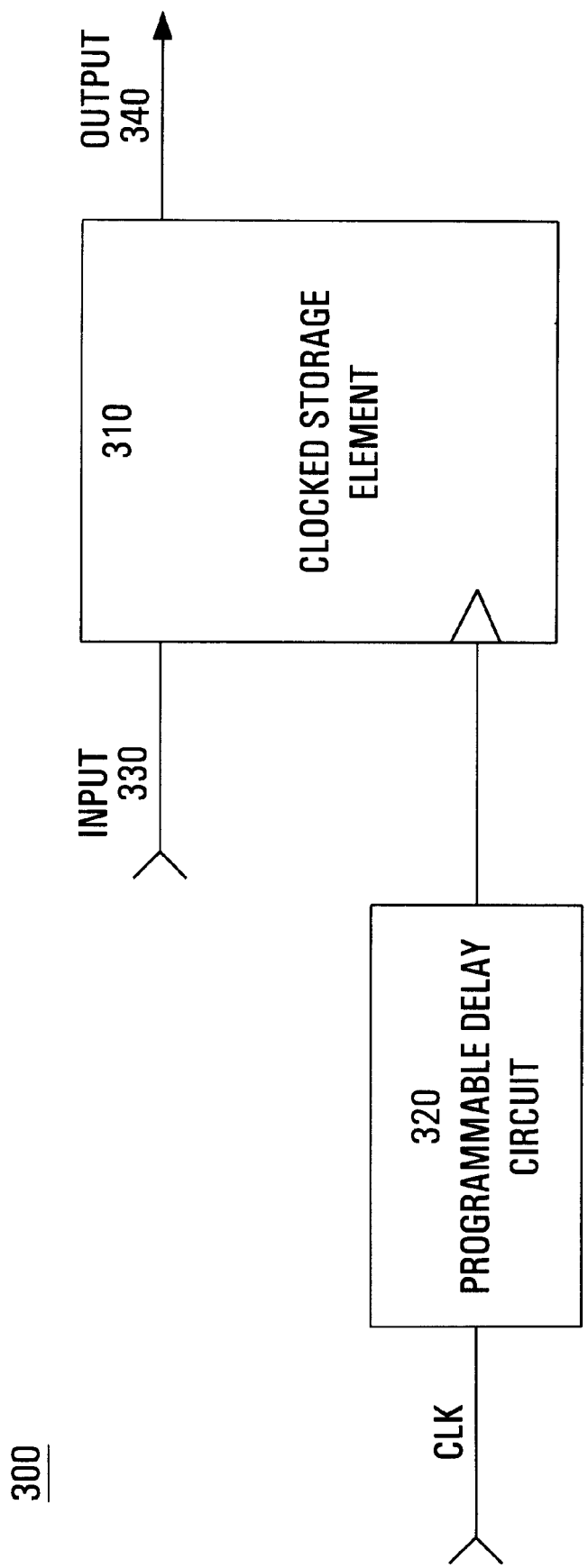
FIG. 3 illustrates a block diagram of the present invention.
Figure 3A:
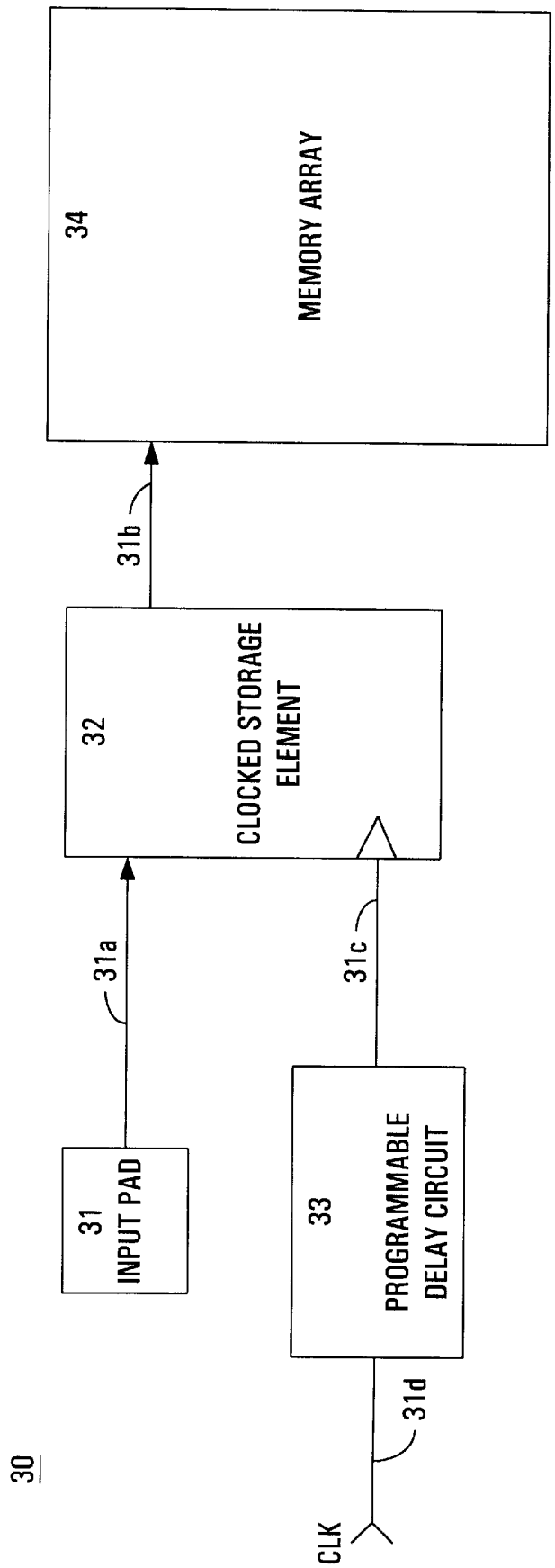
FIG. 3a illustrates an embodiment of the present invention used to optimize the input timing of data in an integrated circuit.
Figure 3B:
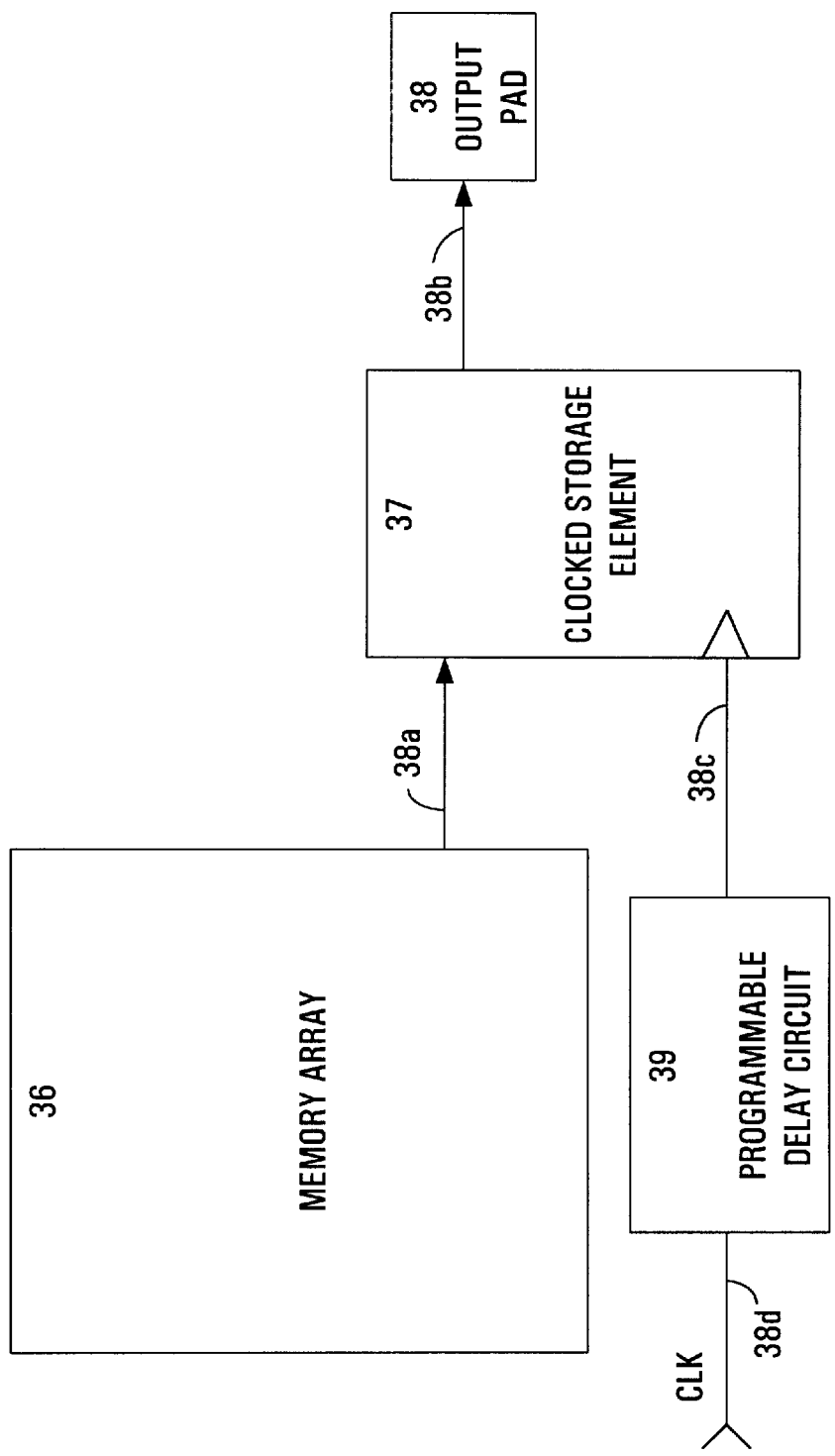
FIG. 3b illustrates an embodiment of the present invention used to optimize the output timing of data in an integrated circuit.

The present invention is illustrated in FIG. 3. The programmable skew buffer 300 comprises a clocked storage element 310 coupled to a programmable delay circuit 320. The clocked storage element 310 has an input 330 and an output 340. FIG. 3*a* and FIG. 3*b* are alternative embodiments illustrating the programmable skew buffer 300 as an input buffer 30 coupled to an input pin and as an output buffer 35 coupled to an output pin, respectively. Therefore, in an integrated circuit, each input pin is coupled to an input buffer 30, each output pin is coupled to an output buffer 35, and each I/O (input/output) pin is coupled to one input buffer 30 and one output buffer 35.

The programmable skew buffer 30 in FIG. 3*a* includes a clocked storage element 32 and a programmable delay circuit 33. The clocked storage element 32 may be a latch, a register or any other storage element where the timing of an input clock can optimize the input or output timing. In one embodiment, the clocked storage element 32 is a D flip-flop which is coupled to an input pad 31 via line 31*a* and a memory array 34 via line 31*b*. Input data at input pad 31 is clocked into clocked storage element 32, in response to either the rising or falling edge of the input clock signal into the clocked storage element 32. The input data clocked into the clocked storage element 32 is outputted to the memory array 34.

The input clock signal into the clocked storage element 32 is generated by the programmable delay circuit 33 which is coupled to clocked storage element 32 via line 31*c*. The programmable delay circuit 33 receives an on-chip clock signal at 31*d*. In one embodiment, the on-chip clock signal is an advanced version of the system clock signal. An advanced version of the system clock signal can be generated with a phase lock loop (not shown). By passing the on-chip clock signal through the programmable delay circuit 33, one of a plurality of clock signals which are delayed and referenced from the system clock, is generated. In other words, the programmable delay circuit 33 generates a delayed version of the on-chip clock signal. The output of the programmable delay circuit 33 is coupled to the clock input of the clocked storage element 32 via line 31*c* such that the delayed version of the on-chip clock signal operates as the input clock signal for the clocked storage element 32. In an alternative embodiment, the programmable delay circuit may be replaced by a clock generating circuit that generates a plurality of clock signals having different phases without limiting the plurality of clock signals to a delayed version of the on-chip clock signal.

The programmable skew buffer 35 in FIG. 3*b* includes a clocked storage element 37 and a programmable delay circuit 39. The clocked storage element 37 may be a latch, a register or any other storage element where the timing of an input clock can optimize the input or output timing. In one embodiment, the clocked storage element 37 is a D flip-flop which is coupled to a memory array 36 via line 38*a* and to an output pad 38 via line 38*b*. Input data from the memory array 36 is clocked into the clocked storage element 37 in response to either the rising or the falling edge of the input clock signal for the clocked storage element 37. The input data clocked into the clocked storage element 37 is outputted to the output pad 38 over line 38*b*, which is coupled to an output pin (not shown). The input clock signal into the clocked storage element 37 is generated by the programmable delay circuit 39 which is coupled to the clocked storage element 37 via line 38*c*. The programmable delay circuit 39 receives an on-chip clock signal at 38*d*. In one embodiment the on-chip clock signal is an advanced version of a system clock signal. An advanced version of the system clock signal can be generated with a phase lock loop (not shown). By passing the on-chip clock signal through the programmable delay circuit 39, one of a plurality of clock signals, which is delayed, is generated. In other words, the programmable delay circuit 33 generates a delayed version of the on-chip clock signal. The output of the programmable delay circuit 39 is coupled to the clock input of the clocked storage element 37 via line 38*c* such that the delayed version of the on-chip clock signal operates as the input clock signal for the clocked storage element 37.

Figure 4:
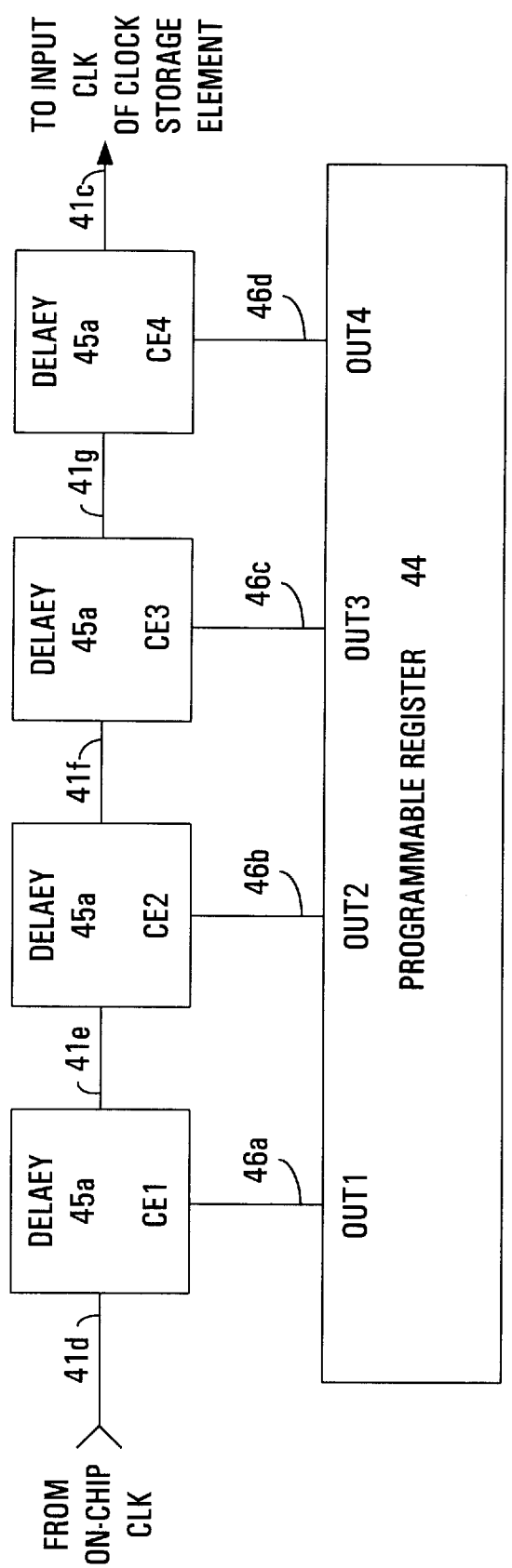
FIG. 4 illustrates a block diagram of the programmable delay circuit in the present invention.

FIG. 4 illustrates a block diagram of a programmable delay circuit 43. The programmable delay circuit 43 includes a programmable register 44 and a plurality of delay units 45*a*–45*d*. Delay units 45*a*–45*d* are coupled in a serial order such that the input of delay unit 45*a* receives the on-chip clock signal over line 41*d* and the output of the delay unit 45*a* is coupled to an input of the delay unit 45*b* over line 41*e*. Furthermore, the output of the delay unit 45*b* is coupled to the input of the delay unit 45*c* over line 41*f*, and the output of the delay unit 45*c* is coupled to the input of the delay unit 45*d*. Lastly, the output of the delay unit 45*d* is coupled to the clock input of the clocked storage element over line 41*c*.

Each of the delay units 45*a*–45*d* delays the on-chip clock signal a predetermined amount of time. For example, the delay unit 45*a* has a predetermined delay of 100 ps, the delay unit 45*b* has a predetermined delay of 200 ps, the delay unit 45*c* has a predetermined delay of 400 ps and the delay unit 45*d* has a predetermined delay of 800 ps. In this example, the four delay units 45*a*–45*d* provide the programmable delay circuit 43 with 16 different delay settings ranging from a zero delay to a delay of 1500 ps, at 100 ps increments.

The programmable delay circuit 43 is programmed by enabling or disabling each of the delay units 45*a*–45*d*. When a delay unit is enabled, the on-chip clock signal is delayed a predetermined amount of time when the on-chip clock signal passes through the enabled delay unit and when a delay unit is disabled, the on-chip clock signal passes through or bypasses the disabled delay unit with little or no delay.

For example, if the delay unit 45*a*, which has a predetermined delay of 100 ps is enabled and the delay units 45*b*, 45*c* and 45*d* are disabled, the on-chip clock signal is delayed by 100 ps. It is possible that more than one delay unit in the string of delay units serially connected may be enabled. If more than one delay unit is enabled, than the total delay programmed by programmable delay circuit 43 is the sum of the predetermined delays for each of the delay units enabled. For example, if both of the delay units 45a and 45c are enabled and the delay units 45b and 45d are disabled, then the total delay programmed is 500 ps (100 ps+400 ps).

According to FIG. 4, the programmable Register 44 outputs a plurality of control signals via outputs $OUT_1$–$OUT_4$ to the chip enable inputs $CE_1$–$CE_4$ of each of delay units 45a–45d. The chip enable input $CE_1$ of the delay unit 45a is coupled to the output $OUT_1$ via line 46a, the chip enable input $CE_2$ of delay unit 45b is coupled to the output $OUT_2$ via line 46b, the chip enable input $CE_3$ of delay unit 45c is coupled to the output $OUT_3$ via line 46c, and the chip enable input $CE_4$ of delay unit 45d is coupled to the output $OUT_4$ via line 46d. When the programmable register 44 generates a control signal having a first voltage level, the corresponding delay unit is enabled and when programmable register 44 generates a control signal having a second voltage level, the corresponding delay unit is disabled. The first and second voltage levels may represent logical-one and logical-zero voltage levels, respectively. Therefore, if the programmable register 43 outputs "0100" over the outputs $OUT_1$, $OUT_2$, $OUT_3$, and $OUT_4$, respectively, then the programmable delay circuit 33 is programmed to delay the on-chip clock signal by 200 ps.

Figure 7:
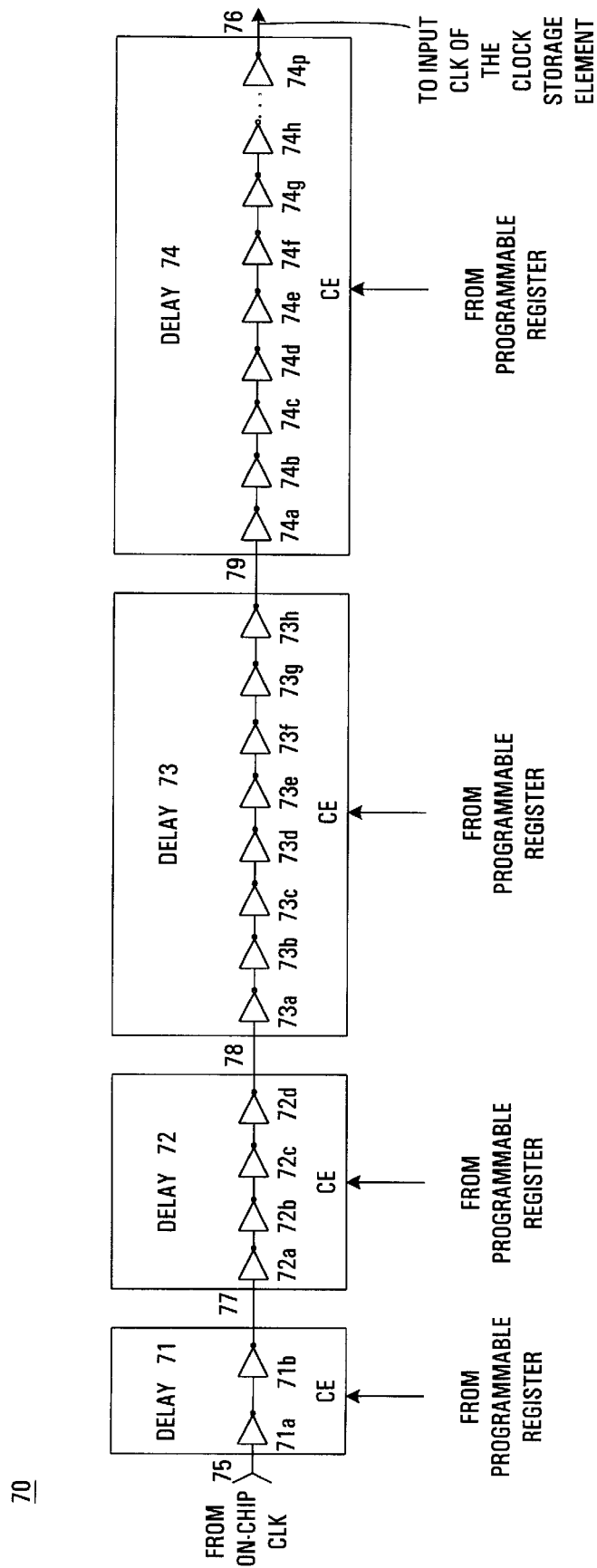
FIG. 7 illustrates one embodiment of the delay units in the programmable delay circuit.

The delay units 45a–45d in FIG. 4 may be configured as the delay units 71-74 in FIG. 7. The delay unit 71 receives the on-chip clock signal at node 75, which may be an advanced version of the system clock signal. The delay unit 74 outputs a delayed version of the on-chip clock signal at node 76. Furthermore, the chip enable (CE) of each delay unit 71–74 is coupled to the programmable register such that each of the delay units 71–74 can be either enabled or disabled to create the desired delay through delay units 71–74.

The delay unit 71 is coupled to the delay unit 72 at node 77 which is coupled to the delay unit 73 at node 78 which is coupled to the delay unit 74 at node 79. Assuming inverters 71a–b, 72a–d, 73a–h and 74l–p each have a delay of 50 ps then the delay unit 71 has a predetermined delay of 100 ps when enabled, the delay unit 72 has a predetermined delay of 200 ps when enabled, the delay unit 73 has a predetermined delay of 400 ps when enabled, and the delay unit 74 has a predetermined delay of 800 ps when enabled. Each of the inverters 71a–b, 72a–d, 73a–h and 74l–p may be a CMOS inverter having a p-channel MOS transistor coupled to an n-channel MOS transistor. As mentioned above, this particular embodiment has four delay units that provide sixteen delay settings ranging from zero delay to 1500 ps delay, at 100 ps increments. The present can be modified by adding or removing delay units or by changing the predetermined delay of each of the delay units 71–74.

Figure 8:
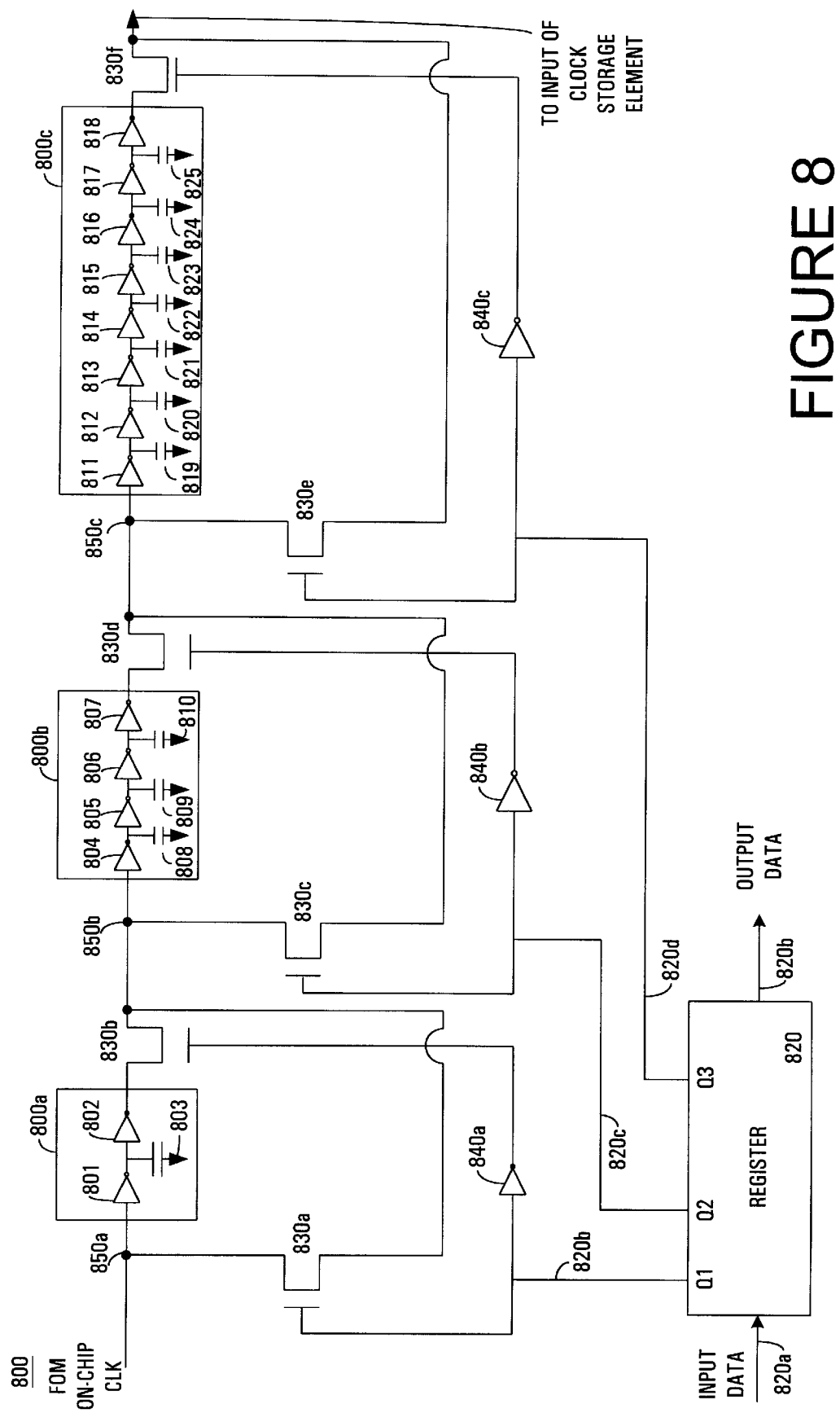
FIG. 8 illustrates one embodiment of the programmable delay circuit.

FIG. 8 illustrates an alternative embodiment of the programmable delay circuit 800. The delay units 800a, 800b and 800c are coupled in a serial order such that the input of the delay unit 800a is coupled to the on-chip clock signal via line 850a and the output of the delay unit 800a is coupled to the input of delay unit 800b via line 850b. Furthermore, the output of the delay unit 800b is coupled to the input of the delay unit 800c and the output of the delay unit 800c is coupled to the clock input of a clocked storage element.

The delay unit 800a includes the inverters 801 and 802 and the capacitor 803. The delay unit 800b includes the inverters 804, 805, 806 and 807 and the capacitors 808, 809 and 810. The delay unit 800c includes the inverters 811, 812, 813, 814, 815, 816, 817 and 818 and the capacitors 819, 820, 821, 822, 823, 824 and 825. The delay units 800a, 800b and 800c each provide a predetermined amount of delay. For example, the delay unit 800a may be designed to have a delay of 100 ps, the delay unit 800b may be designed to have a delay of 200 ps and the delay unit 800c may be designed to have a delay of 400 ps. In this example, the programmable delay circuit 800 provides eight delay options ranging from no delay when all three delay units are disabled to a delay of 700 ps of delay when all three delay units are enabled. Note that one or more of the delay units may be enabled at once to provide the eight delay options at 100 ps increments.

The programmable delay circuit 800 also includes a register 820 that receives input data over line 820a and outputs data over line 820b. The loading and unloading of the register 820 will be discussed in more detail in conjunction with FIG. 9. The register 820 has three outputs, Q1, Q2 and Q3, that output data over lines 820b, 820c and 820d.

In this embodiment, the transistors 830a, 830c and 830e are n-channel metal oxide semiconductor (MOS) transistors and the transistors 830b, 830d and 830f are p-channel MOS transistors. The output data at Q1 is coupled to the gate of transistor 830a and the gate of transistor 830b via inverter 840a such that when the output at Q1 is a "1", transistor 830a is "on", and 830b is "off." This allows the on-chip clock signal at node 850a to bypass the delay unit 800a and pass through transistor 830a to node 850b. On the other hand, if the output at Q1 is a "0", transistor 830a is "off" and 830b is "on." This forces the clock signal at node 850a to pass through delay unit 800a to node 850b, thereby delaying the on-chip clock signal by 100 ps. Furthermore, the output data at Q2 is coupled to the gate of transistor 830c and to the gate of transistor 830d via inverter 840b, and the output data at Q3 is coupled to the gate of transistor 830e and to the gate of transistor 830f via inverter 840c. The delay units 800b and 800c are enabled or disabled in the same manner as the delay unit 800a. In other words, if the output data is a "1" at Q2 or Q3, then the corresponding delay unit is disabled and the on-chip clock signal bypasses the delay unit, and if the output data is a "0", then the corresponding delay unit is enabled and the on-chip clock signal passes through the delay unit. According to FIG. 8, the output data at Q2 corresponds to the delay unit 800b and the output data at Q3 corresponds to the delay unit 800c.

Therefore, if serial data "010" is shifted into the shift register 820, then the delay units 800a and 800c are enabled while the delay unit 800b is disabled such that the programmable delay circuit is programmed to have a delay of 500 ps (100 ps from the delay unit 800a and 400 ps from the delay unit 800c). In an alternative embodiment, transistors 830a, 830c and 830e are p-channel MOS tranistors and transistors 830b, 830d and 830f are n-channel MOS transistors such that each of the delay units is enabled when the output data at the corresponding shift register output is a "0" and disabled when the output data at the corresponding shift register output is a "1".

As discussed above, the data stored in register 820 is used to program the programmable delay circuit 800 to a particular delay setting. This is accomplished by providing a signal from each of the outputs of the register 820 to either enable or disable each of the delay units. In order to load or unload the programming data into the register 820, the memory device must be operating in the programming mode. The programming mode can be selected by asserting a dedicated programming pin or by applying a "super voltage" to a pin having dual functions.

If the memory device has a dedicated programming pin, a predetermined high or low voltage at that pin selects the normal operation mode while the alternative voltage at that pin selects the programming mode. On the other hand, if the memory device has a dual functionality programming pin, then the programming mode can be selected when a "super voltage" is applied to the pin. For example, a "super voltage" may be 3 volts above Vcc. If a "super voltage" is not applied to the dual funcationality pin, then the pin provides a different function such as an input pin.

Once the programming mode has been selected, then several pins can take on a new function. FIG. 10 illustrates the functionality of pins 1–7 during both the programming mode of operation and the normal mode of operation. During the normal mode of operation, pins 1–7 are address pins. However, during the programming mode of operation, such as when a "super voltage" is applied to pin 1 to place the device in the programming mode, pin 2 is used to input the programming clock signal, pin 3 is used to shift programming data in, pin 4 is used to shift programming data out, and pins 5–7 are used for various commands.

Figure 9:
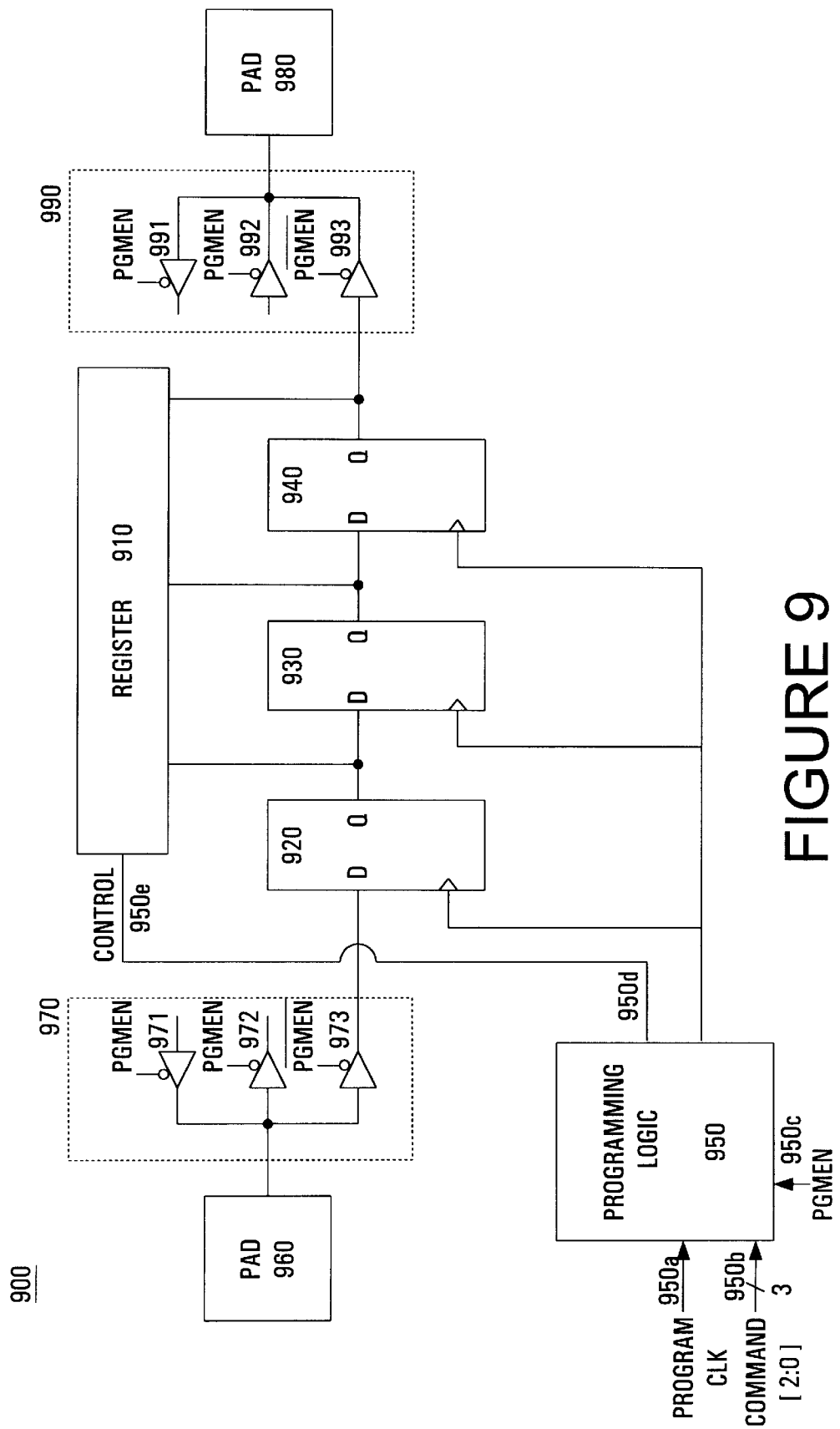
FIG. 9 illustrates a programming circuit for loading and unloading the programming data programmable delay circuit.

FIG. 9 illustrates a programming circuit 900 that is enabled during the programming mode of operation. The register 910 corresponds to the register 820 in FIG. 8 and stores the programming data used to program the programmable delay circuit 800. In one embodiment of the present invention, the pad 960 is coupled to the buffer 970 such that the buffer 970 operates as an input or output buffer for the input or output registers of the memory device during the normal mode of operation, or operates as an input buffer for the programming circuit 900 during the programming mode of operation. In other words, buffer 970 allows the data at the pad 960 to pass to the programming circuit when the programming mode is selected. The buffer 970 includes the inverters 971, 972 and 973. The inverters 971, 972 and 973 each have an enable input (PGMEN) such that during the programming mode, the inverters 971 and 972 are disabled by having PGMEN asserted "high" and the inverter 973 is enabled by having $\overline{\text{PGMEN}}$ asserted "low."

In one embodiment, the memory storage elements 920, 930 and 940 are D-flip-flops such that the programming data at the output of inverter 973 is serially clocked into the data input (D) of the D-flip-flops 920, 930 and 940 in response to the programming clock signal generated by the programming logic 950. The programming logic 950 generates the input clock signal for D-flip-flops 920, 930 and 940 over line 950d. The register 910 receives a control signal from the program logic 950 over line 950e. The programming logic 950 receives the programming clock signal over line 950a and the command signals 0, 1 and 2 over lines 950b and the program enable signal over lines 950c.

Once data has been clocked into all three D-flip-flops 920, 930 and 940, the programming data is available at the outputs (Q) of D-flip-flops 920, 930 and 940 and may be loaded into register 910 to program the delay settings of the programmable delay circuit. In order to change (or reprogram) the delay settings of the programmable delay circuit, new programming data is loaded and stored in the register 910. In one embodiment, the register 910 may include a plurality of SRAM memory cells. Although the number of programming bits in the programming data may vary, FIG. 9 illustrates a register 910 that stores three bits of programming data and therefore, the register 910 has three SRAM memory cells. Typically, the SRAM memory cells can be programmed to store a "1" or a "0" by applying either a first voltage level or a second voltage level to each SRAM memory cell.

The SRAM memory cells may be reprogrammed upon the loading of new programming data into the SRAM memory cells. The new programming data simply replaces the old programming data without requiring any down loading or erasing of the old programming data. In order to verify the programming data in register 910, the data is loaded from the register 910 to the outputs of D flip-flops 920, 930 and 940 and are shifted out through inverter 993 in buffer 990 and outputted from the memory device through pad 980. Buffer 990 operates in a similar manner as buffer 970. The inverter 993 is enabled during the programming mode by being asserted "low" to the $\overline{\text{PGMEN}}$ and provides a path to output old programming data. Furthermore, the inverters 991 and 992 are disabled during the programming mode when PGMEN is asserted "high."

Figure 11:
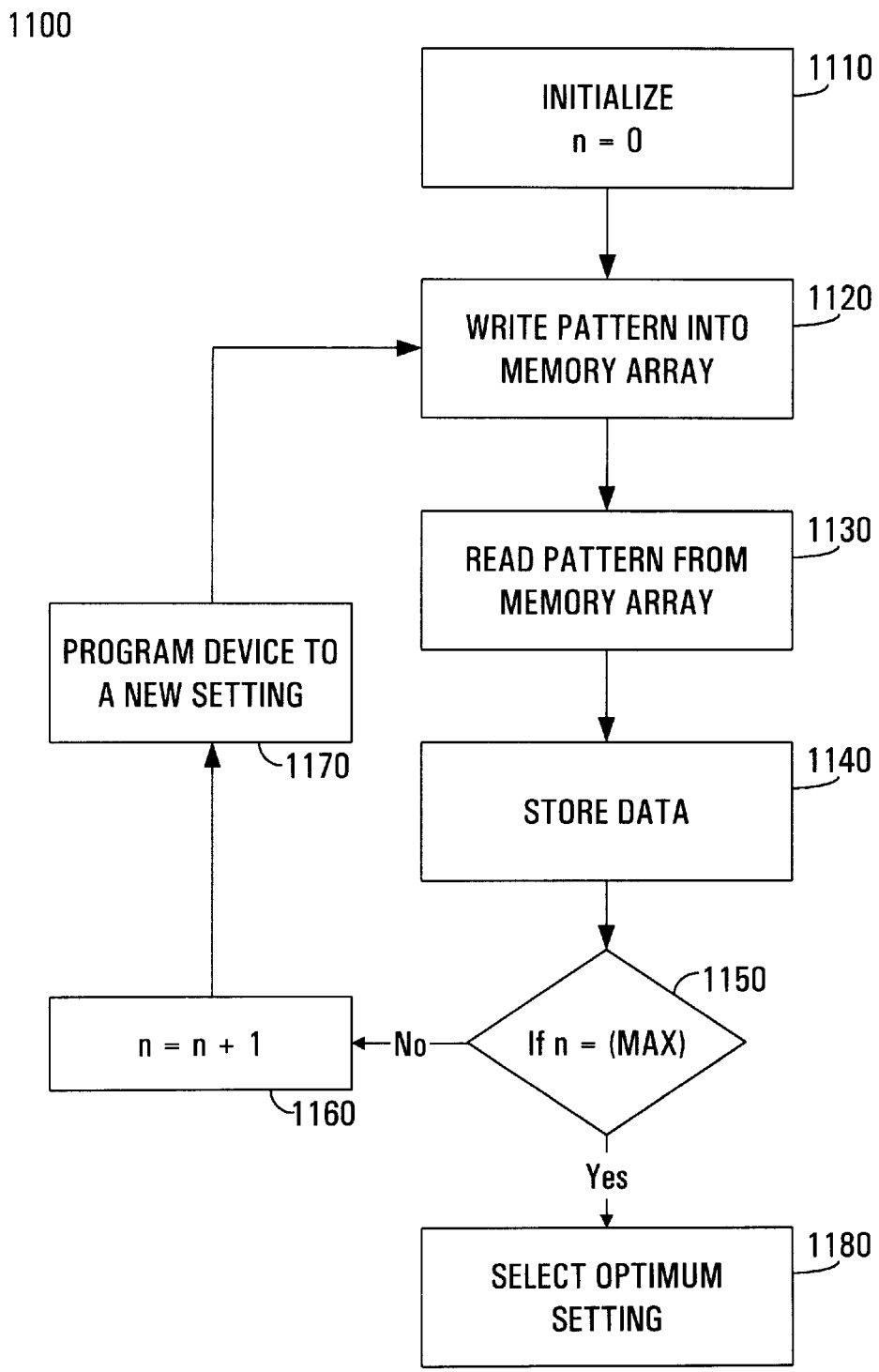
FIG. 11 illustrates the method for selecting the optimum setting.

If the present invention uses an SRAM based memory device, than implementing an SRAM based register 910 is more practical than implementing a register 910 that uses a different technology, such as EPROM of FLASH technology. One advantage of using an SRAM based register 910 is that no technological change to the SRAM is required. In addition, no new technology is required by its processor. Another advantage is that the optimum delay setting of each programmable delay circuit can be determined by using a simple read/write/compare program handled through BIOS during the boot-up sequence when the memory device is used in a computer system. FIG. 11 is an algorithm to determine the optimum setting of each programmable delay circuit when executing a BIOS program. The first step is to initialize the programmable delay circuit by setting the programmable delay unit to have no delay. This occurs when n=0 as shown by box 1110. After the programmable delay circuit is initialized, then a pattern of data is written into the memory array of the memory device and then the pattern of data is read from the memory array. See boxes 1120 and 1130. The data read from the memory array is then stored as shown in box 1140. If the memory device has been tested for all of the possible settings such that n equals the total possible number of settings (as shown in box 1150), the optimum setting is selected. The setting is selected in box 1180 by comparing the stored data for each possible setting to determine the setting that provides the best result. If the memory device has not tested all of the possible settings such that n does not equal the total number of settings, then a new setting is programmed into the memory device to be tested. Once the optimum setting has been determined for each programmable delay circuit in the memory device, then the memory device is set to the programming mode to input the programming data.

What is claimed is:

1. An integrated circuit, comprising:
   a number of input/output pads, each associated with a programmable skew buffer having:
   a clocked storage element having a data input and a clock input; and
   a clock generating circuit having an output coupled to said clock input of said clocked storage element and including a programmable delay path configured to delay an input clock signal by a time according to a delay value stored in a register, the register coupled to receive said delay value from a programming path of said integrated circuit, said programming path including a bypass buffer that allows the register to be bypassed.

2. The integrated circuit of claim 1, wherein the data inputs of said the clocked storage elements of the programmable skew buffers are coupled to input pads of the integrated circuit.

3. The integrated circuit of claim 2, wherein said clocked storage elements further comprise data outputs coupled to a circuit that receives data from said data outputs of said clocked storage elements.

4. The integrated circuit of claim 1 further comprising a circuit coupled to the data inputs of said clocked storage elements.

5. The integrated circuit of claim 4, wherein said clocked storage elements further comprise data outputs each coupled to an output pad of the integrated circuit.

6. The integrated circuit of claim 1, wherein said clocked storage elements are D-type flip-flops.

7. A static random access memory (SRAM) comprising:

a number of clocked storage elements each having a data input for receiving input data and a clock input for receiving a clock input signal, said clocked storage elements each being configured to store input data in response to receiving respective clock input signals; and a number of programmable delay circuits each coupled to a respective one of the clock inputs of said clocked storage elements, said programmable delay circuits each configured to receive a clock signal and to generate corresponding clock input signals for their respective clocked storage elements therefrom, said clock input signals having programmably selected delays from said clock signal according to delay values loaded through programming paths of said SRAM, said programming paths having bypass buffers.

8. The SRAM of claim 7, wherein said data inputs of said clocked storage elements are coupled to respective input pins of the SRAM.

9. The SRAM of claim 8, wherein said clocked storage elements each have a data output coupled to a memory array.

10. The SRAM of claim 7, wherein said data inputs of said clocked storage elements each are coupled to a memory array.

11. The SRAM of claim 10, wherein said clocked storage elements each have a data output coupled to an output pin of the SRAM.

12. The SRAM of claim 7, wherein said clocked storage elements are D flip-flops.

13. The SRAM of claim 7, wherein said programmable delay circuits each have a plurality of delay units coupled in serial order such that an input of a first delay unit receives said clock signal and an output of said first delay unit is coupled to an input of a second delay unit and said plurality of delay units comprising n delay units, an output of an nth delay unit of each programmable delay circuit being coupled to a respective one of the clocked storage elements, each of said delay units having an enable input.

14. The SRAM of claim 13, wherein said programmable delay circuits each include a programmable register, said programmable register having a plurality of outputs, each of said outputs of said programmable register being coupled to a corresponding enable input of one of said plurality of delay units of a respective programmable delay circuit.

15. The SRAM of claim 14, wherein each of said delay units delays said clock signals for a predetermined period when enabled and said clock signal passes through or bypasses each of said delay units with little or no delay when disabled.

16. The SRAM of claim 13, wherein each of said delay units includes a plurality of CMOS inverters connected in a serial order.

17. The SRAM of claim 7, wherein said clock signal is an advanced version of a system clock signal.

18. An integrated circuit, comprising:

a plurality of clocked storage elements distributed at various locations throughout the integrated circuit, each clocked storage element having a data input and a clock input; and a plurality of programmable clock circuits, each associated with a respective one of the plurality of clocked storage elements and each having a clock output coupled to the clock input of its associated clocked storage element, each programmable clock circuit being independently programmable through a programming path having a bypass buffer to adjust input or output timing parameters for the associated clocked storage element.

19. The integrated circuit of claim 18, wherein the data input of one or more of the plurality of clocked storage elements are coupled to associated ones of a plurality of input pins of the integrated circuit.

20. The integrated circuit of claim 18 further comprising a memory array coupled to the data inputs of one or more of the plurality of clocked storage elements.

21. The integrated circuit of claim 18, wherein one or more of the programmable clock circuits are coupled to receive a common input clock signal and the one or more programmable clock circuits each include a register configured to receive a delay setting corresponding to a delay value by which the common input clock signal is to be delayed so as to produce the clock signal for the clocked storage element associated with the programmable clock circuit.

* * * * *